US009562929B2

(12) United States Patent
Noguchi et al.

(10) Patent No.: US 9,562,929 B2
(45) Date of Patent: Feb. 7, 2017

(54) MEASUREMENT DEVICE

(71) Applicant: Mitsubishi Electric Corporation, Tokyo (JP)

(72) Inventors: Takaya Noguchi, Tokyo (JP); Akira Okada, Tokyo (JP); Norihiro Takesako, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 114 days.

(21) Appl. No.: 14/612,892

(22) Filed: Feb. 3, 2015

(65) Prior Publication Data

US 2015/0331011 A1  Nov. 19, 2015

(30) Foreign Application Priority Data

May 13, 2014  (JP) ................. 2014-099814

(51) Int. Cl.
| | | |
|---|---|---|
| *G01R 1/067* | (2006.01) | |
| *G01R 31/26* | (2014.01) | |
| *G01R 1/04* | (2006.01) | |
| *G01R 31/28* | (2006.01) | |

(52) U.S. Cl.
CPC ............ *G01R 1/06777* (2013.01); *G01R 1/04* (2013.01); *G01R 1/067* (2013.01); *G01R 31/2601* (2013.01); *G01R 31/2881* (2013.01); *G01R 31/2887* (2013.01)

(58) Field of Classification Search
CPC . G01R 31/2601; G01R 1/067; G01R 31/2881; G01R 1/06777
USPC ............................ 324/754.01, 755.01–755.07
See application file for complete search history.

(56) References Cited

U.S. PATENT DOCUMENTS

| | | | |
|---|---|---|---|
| 2004/0183561 A1 | 9/2004 | Takekoshi et al. | |
| 2008/0143365 A1* | 6/2008 | Kiesewetter | G01R 31/2881 324/750.03 |
| 2010/0164510 A1* | 7/2010 | Abazarnia | G01R 31/2874 324/555 |
| 2011/0309850 A1 | 12/2011 | Yoshida et al. | |
| 2013/0321011 A1* | 12/2013 | Binder | G01R 31/003 324/750.01 |

(Continued)

FOREIGN PATENT DOCUMENTS

| | | |
|---|---|---|
| JP | H06-066881 A | 3/1994 |
| JP | H07-074219 A | 3/1995 |

(Continued)

*Primary Examiner* — Christopher Mahoney
(74) *Attorney, Agent, or Firm* — Studebaker & Brackett PC

(57) ABSTRACT

A measurement device includes a stage for carrying an object to be measured, an insulating board having a through hole, a probe fixed on the undersurface of the insulating board, a side wall section in a shape surrounding the probe, a pressurizing section provided on the top surface of the insulating board, the pressuring section supplying a gas below the insulating board via the through hole, and a measurement section electrically connected to the probe to control the pressurizing section, wherein the measurement section measures an electric property of the object to be measured via the probe in a state where the pressurizing section is controlled to supply a gas to a measurement space located below the insulating board to increase a pressure in the measurement space, the measurement space surrounded by the stage, the side wall section, and the insulating board.

17 Claims, 4 Drawing Sheets

(56) References Cited

U.S. PATENT DOCUMENTS

2015/0015285 A1\* 1/2015 Shinohara ............ G01R 1/0491
324/750.19

FOREIGN PATENT DOCUMENTS

| JP | H11-271387 A | 10/1999 |
| --- | --- | --- |
| JP | 2003-168709 A | 6/2003 |
| JP | 2007-309806 A | 11/2007 |
| JP | 2011-252792 A | 12/2011 |
| JP | 2012-078310 A | 4/2012 |

\* cited by examiner

MEASUREMENT DEVICE

BACKGROUND OF THE INVENTION

Field of the Invention

The present invention relates to a measurement device which measures an electric property of an object to be measured by bringing a probe into contact with the object to be measured.

Background Art

Japanese Unexamined Patent Publication No. 2011-252792 discloses a measurement device which applied a high voltage to an object to be measured within a pressurized reservoir in a state where an air pressure in the pressurized reservoir is increase by pressurizing means.

At the time of measuring an electric property of an object to be measured, it is common to use an insulating board and a probe which is fixed to the insulating board concerned. In order therefor, it is preferable to suppress an electric discharge between, for example, the object to be measured and the measurement device while maintaining the common structure concerned as far as possible.

In the measurement device disclosed in Japanese Unexamined Patent Publication No. 2011-252792, increases in the air pressure inside the pressurized reservoir by the pressurizing means makes it possible to suppress the electric discharge. However, the measurement device concerned has the dedicated pressurized reservoir, and a test terminal dedicated to insertion into the pressurized reservoir. There was thus a problem that the structure is complicated because it is impossible to maintain the common structure described above.

SUMMARY OF THE INVENTION

The present invention was made in order to solve the above-described problem and has an object to provide a measurement device capable of suppressing an electric discharge while maintaining a common structure.

The features and advantages of the present invention may be summarized as follows.

According to one aspect of the present invention, a measurement device includes a stage for carrying an object to be measured, an insulating board having a through hole, a probe fixed on the undersurface of the insulating board, a side wall section in a shape surrounding the probe, a pressurizing section provided on the top surface of the insulating board, the pressuring section supplying a gas below the insulating board via the through hole, and a measurement section electrically connected to the probe to control the pressurizing section, wherein the measurement section measures an electric property of the object to be measured via the probe in a state where the pressurizing section is controlled to supply a gas to a measurement space located below the insulating board to increase a pressure in the measurement space, the measurement space surrounded by the stage, the side wall section, and the insulating board.

Other and further objects, features and advantages of the invention will appear more fully from the following description.

DETAILED DESCRIPTION OF THE PREFERRED EMBODIMENTS

Figure 1:
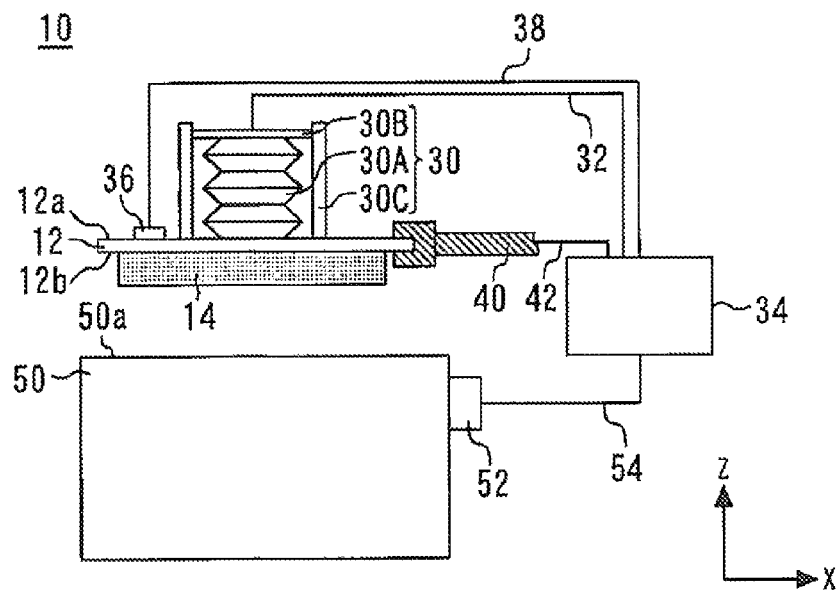
FIG. 1 is a front view of a measurement device according to Embodiment 1.

A measurement device according to Embodiments of the present invention will be described with reference to drawings. Like reference numerals may be given to same or corresponding components to omit the repeated explanation.

Embodiment 1

FIG. 1 is a front view of a measurement device 10 according to Embodiment 1 of the present invention. The measurement device 10 is provided with an insulating board 12. The insulating board 12 has a top surface 12a and an undersurface 12b. A side wall section 14 formed in a cylindrical shape is fixed on the undersurface 12b of the insulating board 12. The side wall section 14 is made of an insulator such as PPS resins, for example.

Figure 2:
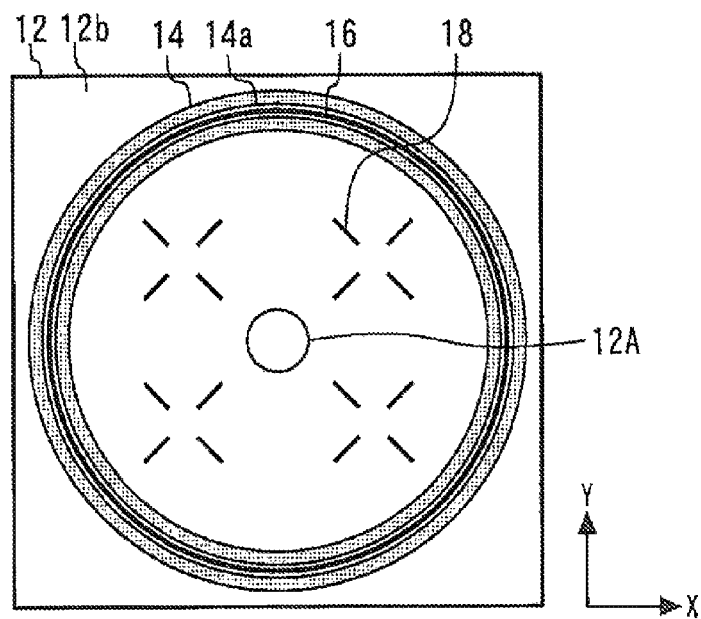
FIG. 2 is a bottom view of the insulating board and the side wall section.

FIG. 2 is a bottom view of the insulating board 12 and the side wall section 14, etc. A through hole 12A is formed in the center of the insulating board 12. A plurality of probes 18 is fixed on the undersurface 12b of the insulating board 12. A material for forming the probe 18 is not specifically limited as long as it possesses conductivity; the probe is made of, for example, a metal material, such as copper, tungsten, or rhenium-tungsten. Also, the probe may be coated with gold, palladium, tantalum, or platinum, etc., to improve conductivity and durability of the probe. Furthermore, although FIG. 2 shows the cantilever-type probe, the probes may be spring-type probes having slidability in z-direction, stacked probes, wire probes, etc.

The side wall section 14 has an annular shape surrounding the probes 18 and the through hole 12A. A curved surface constitutes an inner wall of the side wall section 14. A groove 14a is formed on the bottom surface of the side wall section 14. The groove 14a is provided with a first elastic body 16.

The explanation will return to that of FIG. 1. A pressurizing section 30 is fixed on the top surface 12a of the insulating board 12. The pressurizing section 30 is for supplying a gas via the through hole 12A of the insulating board 12 to the lower side (a measurement space 102) of the insulating board 12. The pressurizing section 30 is provided with a bellows 30A, a driving section 30B, and a support section 30C. The bellows 30A is made of a metal material. The driving section 30B is a part which shrinks or expands the bellows 30A. The driving section 30B is connected to a measurement section 34 by a signal line 32. The measurement section 34 controls the operation of the driving section 30B. The support section 30C is a part for supporting the driving section 30B.

The top surface 12a of the insulating board 12 is provided with a connection section 36 which is electrically connected with the probes 18. The probes 18 and the connection section 36 are connected to each other by way of, for example, a metal plate provided on the top surface 12a of the insulating board 12. The connection section 36 is connected to the measurement section 34 by way of a signal line 38. Therefore, the measurement section 34 is electrically connected to the probes 18.

The measurement device 10 is provided with an arm 40 for moving the insulating board 12. The arm 40 is connected to the measurement section 34 by way of a signal line 42. The operation of the arm 40 is controlled by the measurement section 34. In addition, a plurality of the arms 40 may move one insulating board 12.

The measurement device 10 is provided with a stage 50 having a top surface 50a. The stage 50 is structured to carry an object to be measured on the top surface 50a to fix the object to be measured by means of vacuum suction or electrostatic attraction, etc. The stage 50 is provided with a connection section 52 which is electrically connected with the stage 50. The connection section 52 is connected to the measurement section 34 by way of a signal line 54. Therefore, the measurement section 34 is electrically connected with the stage 50.

Figure 3:
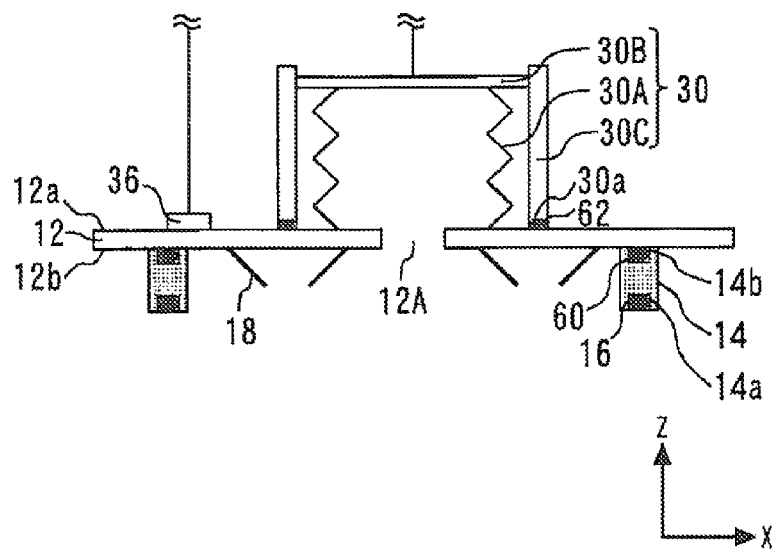
FIG. 3 is a cross sectional view of the insulating board, the side wall section, and the pressurizing section.

FIG. 3 is a cross sectional view of the insulating board 12, the side wall section 14, and the pressurizing section 30. The first elastic body 16 is provided in the groove 14a formed on the undersurface of the side wall section 14. A second elastic body 60 is provided in the groove 14b formed on the upper surface of the side wall section 14. The second elastic body 60 is provided to be located between the side wall section 14 and the insulating board 12 so as to prevent an air from circulating between the side wall section 14 and the insulating board 12. In order thereto, it is preferable that the side wall section 14 and the insulating board 12 elastically deform the second elastic body 60.

A third elastic body 62 is provided in a groove 30a formed on the undersurface of the support section 30C. The third elastic body 62 is provided between the pressurizing section 30 (the support section 30C) and the insulating board 12 so as to prevent an air from circulating between the pressurizing section 30 and the insulating board 12. In order thereto, it is preferable that the support section 30C and the insulating board 12 elastically deform the third elastic body 62. In addition, each of the first to third elastic bodies 16, 60, and 62 are formed of, for example, an O-ring.

Figure 4:
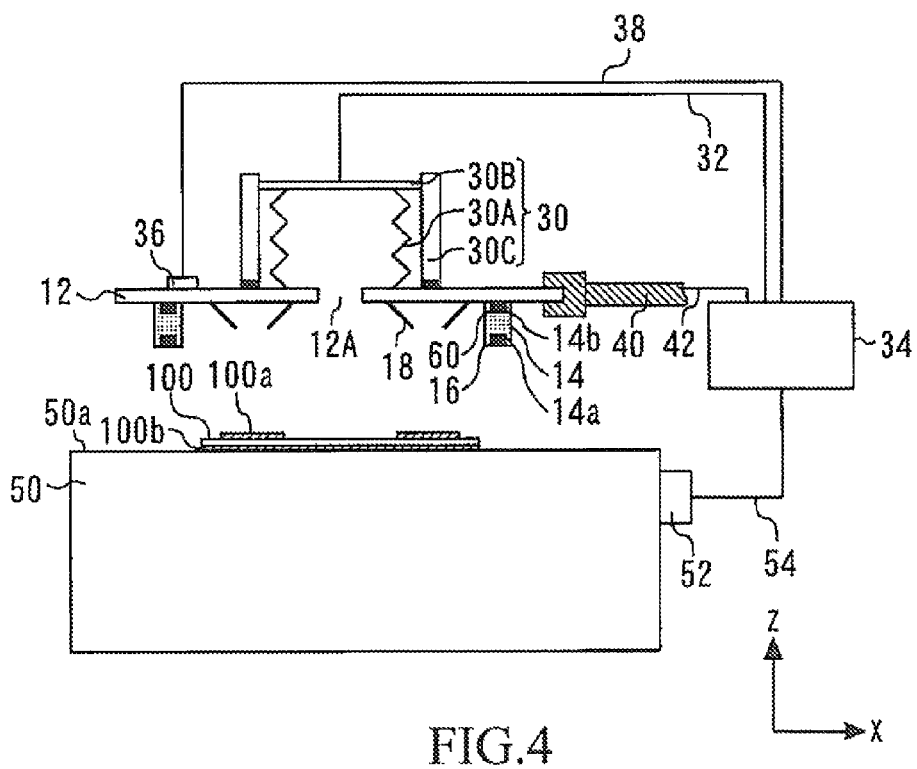
FIG. 4 shows an object to be measured and other components.

The operation of the measurement device 10 will be described. First, as shown in FIG. 4, an object to be measured 100 is put on the top surface 50a of the stage 50. The object to be measured 100 has an upper surface electrode 100a and a lower surface electrode 100b.

Figure 5:
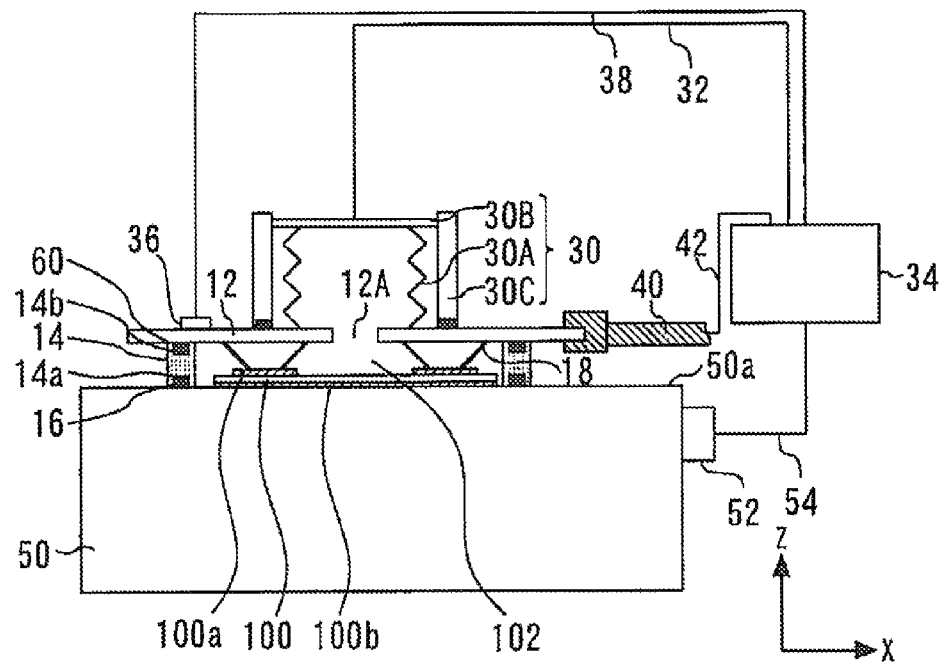
FIG. 5 shows the insulating board transferred toward z-negative direction.

Then, as shown in FIG. 5, the measurement section 34 moves the arm 40 holding the insulating board 12 in the z-negative direction. This brings the probe 18 into contact with the upper surface electrode 100a of the object to be measured 100. At that time, the first elastic body 16 is located between the side wall section 14 and the stage 50 to prevent an air from circulating between the side wall section 14 and the stage 50. In order thereto, it is preferable that the side wall section 14 and the stage 50 elastically deform the first elastic body 16. This produces a measurement space 102 surrounded by the stage 50, the side wall section 14, and the insulating board 12. The measurement space 102 is located below the insulating board 12.

The probes 18 and the object to be measured 100 are situated inside the measurement space 102. The measurement space 102 communicates with the inside the bellows 30A via the through hole 12A. Therefore, the measurement space 102 and the inside the bellows 30A form one sealed space.

Figure 6:
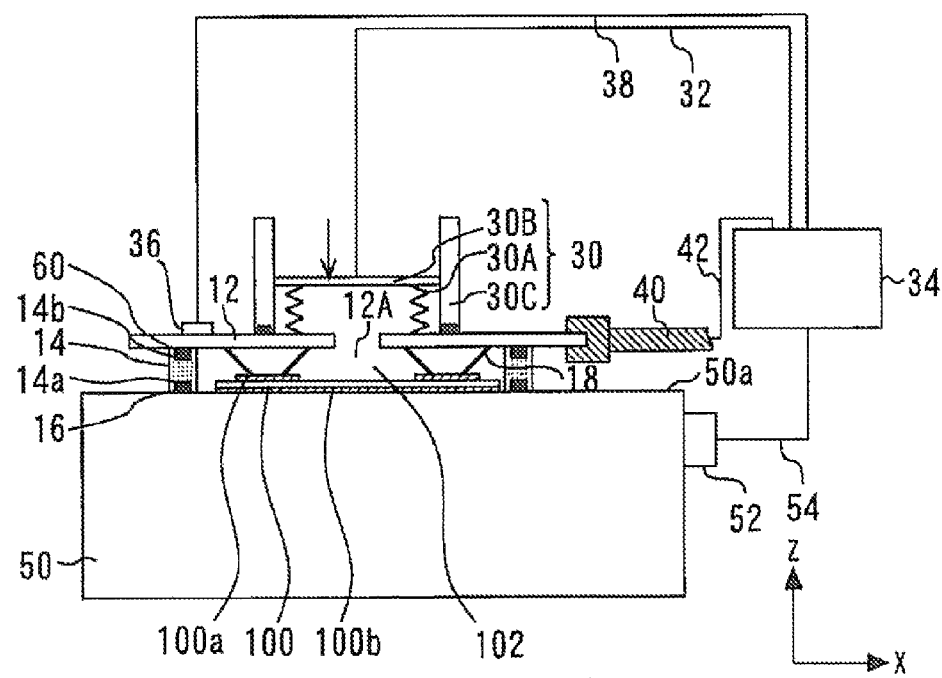
FIG. 6 shows the driving section transferred toward z-negative direction.

Then, as shown in FIG. 6, the driving section 30B is moved in z-negative direction. More specifically, the measurement section 34 shrinks the bellows 30A in z-direction by the driving section 30B, so that a gas is supplied below the insulating board 12 (the measurement space 102) via the through hole 12A. This increases a pressure in the measurement space 102. Increase in pressure in the measurement space 102 is adjusted to the extent of sufficiently raising the voltage to generate an electric discharge with reference to the Paschen's curve.

As described above, the measurement section 34 measures the electric property of the object to be measured 100 via the probes 18 in a state where the pressurizing section 30 is controlled to supply a gas to the measurement space 102 to increase the pressure in the measurement space 102. More specifically, a current is applied between the probes 18 in contact with the upper surface electrode 100a and the stage 50 in contact with the lower surface electrode 100b to measure the electric property of the object to be measured 100.

The measurement device 10 according to Embodiment 1 of the present invention measures the electric property of the object to be measured 100 in a state where a pressure in the measurement space 102 is increased, so that it is possible to prevent the electric discharge which may occur between the object to be measured 100 and the probes 18, for example.

Incidentally, the electric discharge during the measurement may occur not only between the probes and the upper surface electrode, but also between the probes and the end portion of the object to be measured. Therefore, it is preferable to structure the measurement space 102 so that the object to be measured 100 is entirely included in the measurement space 102, in the same manner as the measurement device 10 according to Embodiment 1 of the present invention.

If there is a convex portion or an angular portion on the inner wall of the side wall section 14, charges are collected at the portion concerned to cause an electric discharge. In Embodiment 1 of the present invention, however, the inner wall of the side wall section 14 is formed to be a curved surface, so that it is possible to suppress the electric discharge. In addition, no specific limitation is imposed on the shape of the side wall section, the shape of the inner wall of the side wall section, and the material of the side wall section when increase in pressure in the measurement space 102 yields a sufficient effect on suppressing the electric discharge.

Furthermore, in the measurement device 10, the side wall section 14 and the pressurizing section 30 are provided in a common structure while maintaining the common structure having the insulating board 12 and the probe 18. Therefore, a measurement device having the existing common structure can be utilized to structure the measurement device 10.

Furthermore, as is obvious from FIG. 5 and the like, each of the top surface electrodes 100a comes into contact with the plurality of probes 18 to measure the electric property of the object to be measured 100. Here, the current density of each of the plurality of probes 18 is preferably substantially equal. Then, the connection sections 36, 52 are provided at the position where the plurality of probes 18 is sandwiched between the connection section 36 and the connection section 52, so that the distances from the connection section 36 to the connection section 52 via each of the probe 18 have been made substantially same as one another. This makes it possible to make the current density of each of the plurality of probes 18 substantially equal to one another.

The side wall section 14 and the pressurizing section 30 do not have to be fixed on the insulating board 12. More specifically, the side wall section 14 and the pressurizing section 30 may be detachable from the insulating board 12. This makes it possible to easily replace parts of the side wall section 14 or the pressurizing section 30 at low cost.

The bellows 30A is made of a metal material in order to suppress expansion and shrinkage of the wall face of the bellows 30A. Therefore, the bellows may be made of materials other than the metal material, such as resin, etc., as long as the wall face of the bellows does not expands or shrinks in accordance with change in pressure.

A groove may be formed on the stage 50 instead of forming the groove 14a, and a groove may be formed on the undersurface 12b of the insulating board 12 instead of forming the groove 14b on the side wall section 14.

The object to be measured 100 is not only limited to a vertical element passing a current in the vertical direction (Z-direction), but may be a horizontal element passing a current in the horizontal direction (X-direction). When the horizontal element is measured, the connection section 52 and the signal line 54 can be omitted because it is not necessary to use the stage 50 as an electrode. Furthermore, the object to be measured may be in a state of a wafer, or a chip.

Although the arm 40 is put in full use to move the insulating board 12, the structure may be employed in which the insulating board 12 is fixed and the stage 50 is moved. Such variations are applicable as appropriate to a measurement device according to Embodiment described below. Furthermore, the measurement device according to Embodiment described below has a lot of features in common with Embodiment 1, and thus the explanation will be made with a focus on the difference from Embodiment 1.

Embodiment 2

Figure 7:
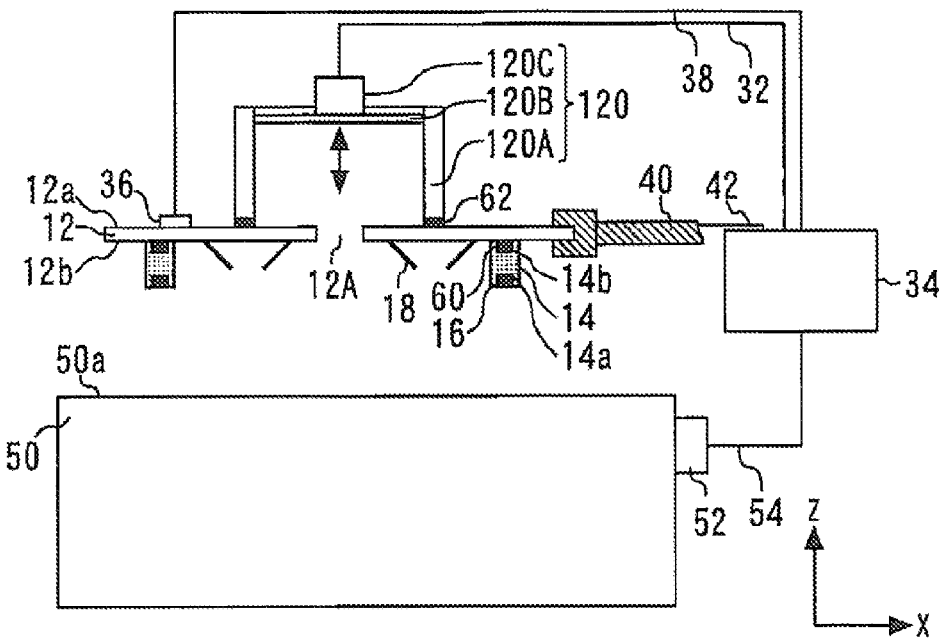
FIG. 7 is a cross sectional view of a measurement device according to Embodiment 2.

FIG. 7 is a cross sectional view of a measurement device according to Embodiment 2 of the present invention. A pressurizing section 120 has a cylinder 120A, a piston 120B moving inside the cylinder 120A, and a driving section 120C for driving the piston 120B. The cylinder 120A is made of a metal material so as to avoid deforming at the time of increasing a pressure in the measurement space.

The measurement section 34 brings the piston 120B closer to the insulating board 12 by the driving section 120C, so that a gas is supplied below the insulating board 12 (measurement space) via the through hole 12A. This makes it possible to increase a pressure in the measurement space. In addition, the driving sections 30B and 120B are composed of, for example, an air cylinder, a hydraulic cylinder, or a motor mechanism.

Embodiment 3

Figure 8:
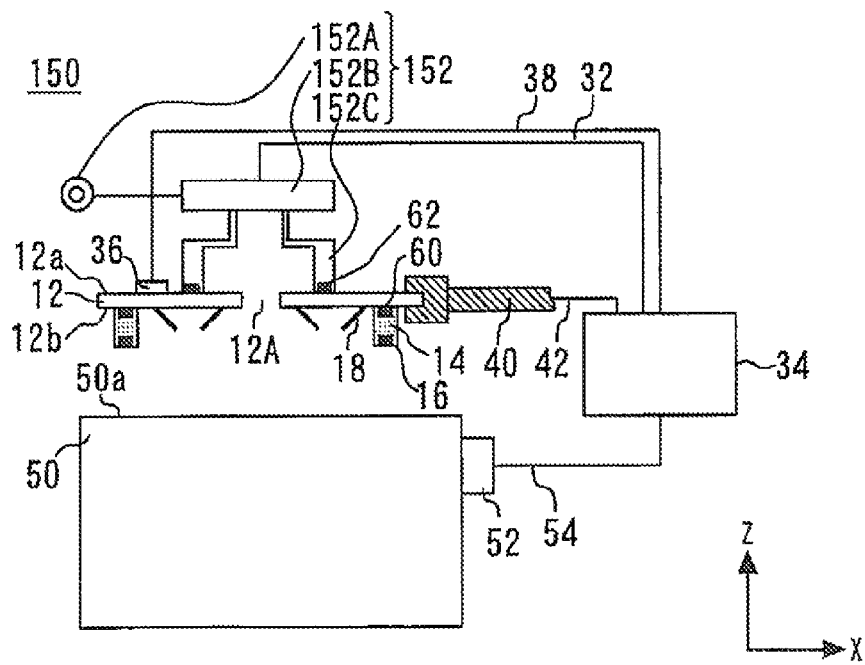
FIG. 8 is a cross sectional view of a measurement device according to Embodiment 3.

FIG. 8 is a cross sectional view of a measurement device 150 according to Embodiment 3 of the present invention. The measurement device 150 is provided with a pressurizing section 152. The pressurizing section 152 is provided with a gas supply source 152A, a regulator 152B connected to the gas supply source 152A, and a reservoir 152C. The reservoir 152C is made of a metal material so as to avoid deforming at the time of increasing a pressure in the measurement space.

The measurement section 34 utilizes the gas supply source 152A to supply a gas below the insulating board 12 (measurement space) via the through hole 12A. More specifically, the measurement section 34 controls the regulator 152B to introduce a high-pressure gas from the gas supply source 152A to the measurement space via the reservoir 152C and the through hole 12A. As a result, the electric property of the object to be measured is measured in a state where the pressure in the measurement space is increased. Since the pressurizing section 152 has no mechanically operating portion, it is possible to shorten the measurement time compared to the case of including the mechanically operating portion (the driving section).

According to the present invention, a side wall section is provided on the undersurface side of an insulating board, and a pressurizing section is provided on the upper surface side of the insulating board, so that it is possible to suppress an electric discharge while maintaining a common structure.

Obviously many modifications and variations of the present invention are possible in the light of the above teachings. It is therefore to be understood that within the scope of the appended claims the invention may be practiced otherwise than as specifically described.

What is claimed is:

1. A measurement device, comprising:
a stage for carrying an object to be measured;
an insulating board having a through hole;
a probe fixed on the undersurface of said insulating board;
a side wall section in a shape surrounding said probe;
a pressurizing section provided on the top surface of said insulating board, the pressuring section supplying a gas below said insulating board via said through hole; and
a measurement section electrically connected to said probe to control said pressurizing section, wherein,
said measurement section measures an electric property of said object to be measured via said probe in a state where said pressurizing section is controlled to supply a gas to a measurement space located below said insulating board to increase a pressure in said measurement space, the measurement space surrounded by said stage, said side wall section, and said insulating board, and
said pressurizing section supplying a gas to said measurement space via only said through hole.

2. The measurement device according to claim 1, wherein an inner wall of said side wall section is a curved surface.

3. The measurement device according to claim 2, wherein said side wall section is formed in a cylindrical shape.

4. The measurement device according to claim 1, wherein said side wall section is made of an insulator.

5. The measurement device according to claim 1, comprising a first elastic body provided between said side wall section and said stage so as to prevent an air from circulating between said side wall section and said stage.

6. The measurement device according to claim 1, comprising a second elastic body provided between said side wall section and said insulating board so as to prevent an air from circulating between said side wall section and said insulating board.

7. The measurement device according to claim 1, wherein said side wall section is fixed on the undersurface of said insulating board.

8. The measurement device according to claim 1, comprising a third elastic body provided between said pressurizing section and said insulating board so as to prevent an air from circulating between said pressurizing section and said insulating board.

9. The measurement device according to claim 1, wherein said pressurizing section is fixed on the top surface of said insulating board.

10. The measurement device according to claim 1, wherein:
said pressurizing section has a bellows and a driving section for shrinking said bellows; and
said measurement section shrinks said bellows by said driving section so as to supply a gas to said measurement space via said through hole.

11. The measurement device according to claim 10, wherein said bellows is made of a metal material.

12. The measurement device according to claim 10, wherein said driving section is an air cylinder, a hydraulic cylinder, or a motor mechanism.

13. The measurement device according to claim 1, wherein:
said pressurizing section has a cylinder, a piston moving inside said cylinder, and a driving section for driving said piston; and
said measurement section brings said piston closer to said insulating board by said driving section, so that a gas is supplied below said measurement space via said through hole.

14. The measurement device according to claim 13, wherein said cylinder is made of a metal material.

15. The measurement device according to claim 1, wherein:
said pressurizing section has a gas supply source; and
said measurement section utilizes said gas supply source to supply a gas below said measurement space via said through hole.

16. A measurement device, comprising:
a stage for carrying an object to be measured;
an insulating board having a through hole;
a probe fixed on the undersurface of said insulating board;
a side wall section in a shape surrounding said probe;
a pressurizing section provided on the top surface of said insulating board, the pressuring section supplying a gas below said insulating board via said through hole;
a measurement section electrically connected to said probe to control said pressurizing section; and
a third elastic body provided between said pressurizing section and said insulating board so as to prevent an air from circulating between said pressurizing section and said insulating board,
wherein said measuring section measures an electric property of said object to be measured via said probe in a state where said pressurizing section is controlled to supply a gas to a measurement space located below said insulating board to increase a pressure in said measurement space, the measurement space surrounded by said stage, said side wall section, and said insulating board.

17. A measurement device, comprising:
a stage for carrying an object to be measured;
an insulating board having a through hole;
a probe fixed on the undersurface of said insulating board;
a side wall section in a shape surrounding said probe;
a pressurizing section provided on the top surface of said insulating board, the pressuring section supplying a gas below said insulating board via said through hole; and
a measurement section electrically connected to said probe to control said pressurizing section, wherein,
said measurement section measures an electric property of said object to be measured via said probe in a state where said pressurizing section is controlled to supply a gas to measurement space located below said insulating board to increase a pressure in said measurement space, the measurement space surrounded by said stage, said side wall section, and said insulating board, and
said pressurizing section is fixed on the top surface of said insulating board.

* * * * *